(12) United States Patent
Koetschau et al.

(10) Patent No.: US 8,907,253 B2
(45) Date of Patent: Dec. 9, 2014

(54) METHOD AND DEVICE FOR PRODUCING A COMPOUND SEMICONDUCTOR LAYER

(75) Inventors: Immo Koetschau, Brandenberg An Der Havel (DE); Dieter Schmid, Munich (DE)

(73) Assignee: Centrotherm Photovoltaics AG, Blaubeuren (DE)

( * ) Notice: Subject to any disclaimer, the term of this patent is extended or adjusted under 35 U.S.C. 154(b) by 0 days.

(21) Appl. No.: 13/510,824

(22) PCT Filed: Oct. 27, 2010

(86) PCT No.: PCT/IB2010/002729
§ 371 (c)(1),
(2), (4) Date: Aug. 1, 2012

(87) PCT Pub. No.: WO2011/061583
PCT Pub. Date: May 26, 2011

(65) Prior Publication Data
US 2012/0289033 A1    Nov. 15, 2012

(30) Foreign Application Priority Data
Nov. 18, 2009    (DE) .......................... 10 2009 053 532

(51) Int. Cl.
| H01L 21/20 | (2006.01) |
| H01L 21/263 | (2006.01) |
| F27B 9/04 | (2006.01) |
| F27B 9/22 | (2006.01) |
| F27B 9/36 | (2006.01) |
| F27D 3/04 | (2006.01) |
| H01L 21/02 | (2006.01) |

(52) U.S. Cl.
CPC .... H01L 21/02568 (2013.01); H01L 21/02614 (2013.01)

USPC ............................ 219/411; 219/388; 118/729

(58) Field of Classification Search
None
See application file for complete search history.

(56) References Cited

U.S. PATENT DOCUMENTS

| 4,517,448 A * | 5/1985 | Crain et al. .................... 219/388 |
| 5,567,469 A | 10/1996 | Wada et al. |
| 6,717,112 B1 * | 4/2004 | Probst ........................... 219/390 |
| 7,514,650 B2 * | 4/2009 | Melgaard et al. ............. 219/388 |
| 7,572,334 B2 * | 8/2009 | Kholodenko et al. ........ 117/200 |
| 7,805,064 B2 * | 9/2010 | Ragay et al. ................... 392/416 |
| 8,039,289 B2 * | 10/2011 | Parks et al. ..................... 438/72 |

(Continued)

FOREIGN PATENT DOCUMENTS

| JP | 2006196771 A | 7/2006 |
| WO | 2007/047888 A2 | 4/2007 |
| WO | 2009/033674 A2 | 3/2009 |
| WO | 2009/051862 A2 | 4/2009 |

*Primary Examiner* — Joseph M Pelham
(74) *Attorney, Agent, or Firm* — Laurence A. Greenberg; Werner H. Stemer; Ralph E. Locher

(57) ABSTRACT

In a method for producing a I-III-VI compound semiconductor layer, a substrate is provided with a coating which has a metallic precursor layer. The coating is kept, for the duration of a process time, at temperatures of at least 350 degrees C. and the metallic precursor layer, in the presence of a chalcogen at an ambient pressure of between 500 mbar and 1500 mbar, is converted into a compound semiconductor layer. The coating is kept at temperatures for the duration of an activation time which attain at least an activation barrier temperature, whereby as the activation barrier temperature a value of at least 600° C. is selected.

12 Claims, 6 Drawing Sheets

(56) References Cited

U.S. PATENT DOCUMENTS

| | | | |
|---|---|---|---|
| 8,236,596 B2* | 8/2012 | Parks et al. | 438/61 |
| 2007/0111367 A1 | 5/2007 | Basol | |
| 2008/0096307 A1 | 4/2008 | Basol | |
| 2008/0280030 A1 | 11/2008 | Van Duren et al. | |
| 2008/0296283 A1* | 12/2008 | Melgaard et al. | 219/388 |
| 2009/0130796 A1* | 5/2009 | Taunier et al. | 438/94 |
| 2009/0183675 A1 | 7/2009 | Pinarbasi et al. | |
| 2010/0151129 A1 | 6/2010 | Schmid et al. | |
| 2010/0203668 A1 | 8/2010 | Schmid et al. | |
| 2010/0220983 A1* | 9/2010 | Doherty et al. | 392/411 |
| 2010/0267188 A1* | 10/2010 | Parks et al. | 438/87 |
| 2011/0011340 A1 | 1/2011 | Basol | |
| 2011/0013892 A1* | 1/2011 | Ragay et al. | 392/411 |
| 2011/0065224 A1* | 3/2011 | Bollman et al. | 438/62 |
| 2011/0120373 A1* | 5/2011 | Bollman et al. | 118/718 |
| 2011/0294254 A1* | 12/2011 | Jackrel et al. | 438/95 |
| 2012/0305049 A1* | 12/2012 | Yuya et al. | 136/244 |
| 2013/0040420 A1* | 2/2013 | Bollman et al. | 438/95 |

* cited by examiner

METHOD AND DEVICE FOR PRODUCING A COMPOUND SEMICONDUCTOR LAYER

BACKGROUND OF THE INVENTION

Field of the Invention

The present invention concerns a method for producing a compound semiconductor layer together with a device for carrying out the method.

Environmentally-friendly and inexpensive energy generation is a central problem nowadays. One approach to a solution for this problem is that of collecting photovoltaic current from sunlight by means of solar cells, or solar modules. The greater the conversion efficiency of the solar modules and the lower their costs of manufacture, the lower the cost of generating the current. Against this background, so-called thin-layer solar modules are a promising approach to a solution, since these can be produced at little cost in terms of material and energy and also enable a good conversion efficiency, i.e. high grades of efficiency. In particular, thin-layer solar modules based on I-III-VI-compound semiconductors have proven their value. These include, for example, compound semiconductors consisting of copper-indium-selenide (CIS) or copper-indium-gallium-selenide (CIGS).

Compound semiconductor layers can be manufactured in various ways, for example by co-evaporation of the elements involved. Another manufacturing option involves so-called deposition-reaction-processes, in which, firstly, a metallic precursor layer is deposited and this is subsequently converted with a chalcogen into the respective compound semiconductor. One embodiment of such a deposition-reaction-process, in which the metallic precursor layer is thermally converted in a simple and rapid continuous process into the compound semiconductor layer, is described in patent document WO 2009/033674 A2.

In thin-layer solar cells, or thin-layer solar cell modules, efficiency is influenced, inter alfa, by the homogeneity of the compound semiconductor layer used. It has emerged in deposition-reaction-processes that elements of the compound semiconductor, for example gallium, can spread out inhomogeneously over the thickness of the compound semiconductor layer. This is especially the case when process times are short for technical production reasons. Said gallium builds up, for example, preferably on a back contact, which is usually applied onto a substrate in the form of a metallic layer, before the metallic precursor layer is deposited onto this back contact and this is converted into a compound semiconductor. As a result of this build-up on the back contact, the gallium is spread inhomogeneously over the thickness of the compound semiconductor layer. FIG. 1 illustrates this type of inhomogeneous distribution using the example of a CIGS compound semiconductor layer. The depth shown therein has its neutral point on the upper side of the compound semiconductor layer and increases in its value towards the back contact arranged on the substrate, which in the illustration in FIG. 1 would be arranged on the right edge of the image. FIG. 1 thus illustrates a build-up of the gallium in the compound semiconductor layer on the back contact. This can lead to a reduced open circuit voltage and hence to a reduced efficiency of the solar cell or the solar module produced from this compound semiconductor layer.

Against this background, the invention is based on the problem of providing a method by means of which a I-III-VI-compound semiconductor layer can be produced economically and with a more homogeneous distribution of the elements involved.

The invention is also based on the problem of providing a device for carrying out the method.

Advantageous refinements are the subject matter of the respective dependant sub-claims.

The method according to the invention makes provision that a substrate is provided with a coating which has a metallic precursor layer. The coating is then kept for the duration of a process time at temperatures of at least 350° C. and the metallic precursor layer is converted, in the presence of a chalcogen and at an ambient pressure of between 500 mbar and 1500 mbar, into the compound semiconductor layer. The coating is also kept for the duration of an activation time at temperatures which attain at least an activation barrier temperature. A value of at least 600° C. is then selected as activation barrier temperature. It is especially preferable for the metallic precursor layer to be converted into the compound semiconductor layer at an ambient pressure of between 850 mbar and 1150 mbar.

The term I-III-VI-compound semiconductor layer is to be understood to mean a layer of a compound semiconductor which is formed from elements from Group IB of the periodic table of the elements, for example copper, from elements of Group IIIA of the periodic table of the elements, for example aluminium, gallium or indium, and at least one chalcogen from Group VIA of the periodic table, for example sulphur, selenium or tellurium.

In an especially preferred embodiment of the invention, the metallic precursor layer is converted into a CIS- or CIGS compound semiconductor layer.

The fact that the coating is kept at temperatures of at least 350° C. is not to be understood to mean that the coating is heated to a defined temperature and kept at this defined temperature throughout the entire process time. Instead, the invention makes provision that during the process time, the coating is at any temperature greater than or equal to 350° C. The temperature of the coating can vary during the process time, but during the process time it is always at least 350° C.

The keeping of the coating at temperatures which reach at least an activation barrier temperature is to be understood in the same way. The coating can thus take on any temperatures during the activation time which are greater than or equal to the activation barrier temperature. The temperature of the coating can vary during the activation time, but it is always equal to at least the activation barrier temperature.

A coating in the sense of the present invention can consist solely of a metallic precursor layer, for example a layer containing the metals copper, gallium and indium, or contain further components, for example a chalcogen layer, which is deposited onto the metallic precursor layer. The term of the coating thus encompasses, in the present invention, all layers arranged on the substrate and the metallic back contact layer which may be provided there. The coating consists, after partial conversion of the metallic precursor layer, for example, partly of a compound semiconductor. The compound semiconductor layer which is present following complete conversion thus likewise represents a coating in the present sense.

As already mentioned, a chalcogen, in particular selenium, can be deposited as part of the coating onto the metallic precursor layer, in particular by means of a physical deposition from the vapour phase at atmospheric pressure. This chalcogen serves, during the process time, as chalcogen source for the conversion of the metallic precursor layer into the compound semiconductor layer. In addition or as an alternative to this chalcogen coating, a chalcogen-containing gas can be fed in during the process time of the coating, for example a carrier gas containing chalcogen vapour. An inert gas such as nitrogen or a noble gas can be used as carrier gas in this instance.

The process time can in principle be interrupted by phases in which the temperature of the coating is lower than 350° C. In such a case, the process time is composed of the sum of those times in which the temperature of the coating is greater than or equal to 350° C.

Advantageously, the substrate is provided with a back contact. For example, a metal layer as back contact can be provided on a glass substrate, in particular a molybdenum layer. The back contact is preferably divided into several strips by means of structuring, as a result of which a series connection of various solar cell elements of the completed solar module can be realised. Said molybdenum coating does not represent a component of the metallic precursor layer or of the coating in the sense of the present invention.

In principle, any substrates can be used in the method according to the invention which are not adversely affected, while the method is being carried out, by the effect of heat or chemical reactions. Apart from glass substrates, for example, strips of metal can thus also be used.

The metallic precursor layer can for example contain copper, indium and gallium and be applied using technologies of prior art, for example by means of sputtering. The metallic precursor layer can then in principle consist of several metallic layers, for example firstly a layer containing copper and gallium can be provided and a layer of indium can be applied onto this. The metallic precursor layer can also be built up from several sub-layers of the same type, for example several layers containing copper and gallium. Repeating sequences of layers can also be provided.

Using the method according to the invention, it is possible to produce compound semiconductor layers in which the elements involved are distributed more homogeneously over the thickness of the compound semiconductor layer. This is illustrated by way of example in FIG. 2, in which, corresponding to the image in FIG. 1, the gallium-depth distribution is shown in a CIGS compound semiconductor layer produced using the method according to the invention. A comparison of FIGS. 1 and 2 shows a clearly more homogeneous depth distribution of the gallium in the CIGS compound semiconductor layer from FIG. 2. It would therefore be possible to produce solar modules with significantly improved efficiency from this compound semiconductor layer from FIG. 2.

The selection of a suitable activation barrier temperature depends on various parameters. So, for example, with greater availability of chalcogen during the process time, even from an activation barrier temperature of 600° C., a comparatively homogeneous gallium distribution in a CIGS compound semiconductor layer can be realised. In practice an activation barrier temperature of 640° C. has proven its value, and this should preferably be used.

In one advantageous variant embodiment of the invention, the coating, at least during the process time, is arranged in a protective gas atmosphere. Preferably, the coating is already arranged in the protective gas atmosphere during a heating phase preceding the process time and this situation is maintained until the coating cools to a non-critical temperature. The arrangement of the coating in a protective gas atmosphere serves, inter alia, to guarantee the least possible oxygen partial pressure during a thermal treatment of the coating, in particular during its conversion into a compound semiconductor layer, since the availability of oxygen could trigger undesirable chemical reactions. This applies in the same way for hydrogen, when selenium is used. An atmosphere containing, for example, nitrogen or at least one noble gas can be provided as protective gas atmosphere.

In one preferred variant embodiment of the method according to the invention, before heating the coating to 350° C., a layer containing at least one chalcogen, preferably sulphur or selenium, is deposited onto the metallic precursor layer. The deposition is advantageously realised by means of a physical deposition from the vapour phase at atmospheric pressure (APPVD). It is especially preferable for the chalcogen deposition to take place in a continuous process.

In one advantageous variant embodiment of the invention, the activation time is selected to be shorter than 500 s, preferably shorter than 250 s.

In one preferred variant embodiment of the method according to the invention, the process time is selected to be shorter than 1200 s, preferably shorter than 600 s and especially preferably between 150 s and 500 s.

One variant embodiment of the method according to the invention makes provision that the coating is heated to higher temperatures in several steps and then cooled. Preferably, this takes place in a segmented continuous furnace, in the various segments of which the coating is brought to various temperatures. 120 seconds has proven its value as dwell time in each segment. The heating of the coating can, however, in principle also take place in a conventional furnace. This can, however, be disadvantageous for industrial production, since this can only be used for batch operation.

In one variant embodiment of the invention, the substrate, if there is one, together with the back contact metallisation arranged thereon, is heated in the same way as the coating arranged on the substrate. This means there are neither heating nor cooling installations present which selectively heat or cool the coating more intensely than the substrate, nor are corresponding heating or cooling installations provided for the substrate, which heat or cool the substrate more intensely than the coating. A cooling installation in this sense should also be understood as a large, thermally inert mass, which, due to thermal coupling, manages to significantly delay the heating of the substrate or the coating by comparison with the other part. In this variant embodiment of the invention, substrate and coating are thus essentially at the same temperature.

One alternative variant embodiment of the method according to the invention makes provision, on the other hand, that the coating, at least during a boost period, is kept at higher temperatures than the substrate. This keeping at higher temperatures is to be understood, in this case, to mean that no defined temperature value is maintained during all or part of the boost period. Rather, the temperatures of coating and substrate can vary during the boost period. But at all times during the boost period, the temperature of the coating is always higher than the temperature of the substrate. Preferably a temperature difference between coating and substrate of at least 30° C., especially preferably of at least 60° C., is provided.

Because the coating is kept at higher temperatures than the substrate, the thermal load on the substrate can be reduced. This extends the range of usable substrate materials.

Advantageously, the coating is kept at a higher temperature than the substrate, at least during the activation time, in order to minimise the thermal load on the latter.

It has been shown that advantageous results can be achieved even with boost periods of 15 s or less.

One refinement of the method according to the invention makes provision that, during the boost period, the temperature of the substrate is kept at values which are safe for the substrate, preferably using float glass as substrate and keeping its temperature to a value of less than 580° C. The word keeping in this case is to be understood to mean that the substrate temperature can also vary in principle, but always has values which are safe for the substrate, so in the case of float glass always lies under 580° C. In this case, a safe temperature value is to be understood as a temperature at which no adverse modification of the substrate occurs, such as for example permanent modifications in a glass structure as a result of significantly exceeding the fusion point, too great a thermal deformation or impairments due to chemical reactions.

In one variant embodiment of the method according to the invention, in order to heat the coating more intensely than the substrate, at least one lamp is used for illuminating the coating. It is preferable to use halogen or xenon lamps for this. The wavelength range of the electromagnetic radiation emitted by the lamps is advantageously adapted to the absorption behaviour of the respective coating. In practice, lamps have proven useful which emit electromagnetic radiation with wavelengths mainly in the range of between 400 and 1200 nm.

In one advantageous variant embodiment, the substrate is reversed under the electromagnetic radiation emitted by the lamps, in order to achieve more intense heating of the coating which is as homogeneous as possible. This can, for example, be realised by an oscillation movement of the substrates. If the coating, as described above, is heated in a segmented continuous furnace, one refinement makes provision that the coating is illuminated with lamps while the substrate is being transported from one segment to the next of the continuous furnace.

One advantageous variant embodiment of the method according to the invention makes provision that during the process time, the substrate is arranged on a thermally inert carrier, preferably a graphite plate. Due to the thermal inertia of the carrier, when there is sufficient thermal conduction between substrate and carrier, the coating can be heated, while the temperature of the substrate, due to the thermal coupling with the carrier and the thermal inertia thereof, follows the temperature of the coating with a delay. If the method is carried out sufficiently quickly, the coating can be brought to a comparatively high temperature, while the substrate reaches only lower temperatures. Before the substrate can reach the higher temperature of the coating, the method and hence the heating process is already completed.

The device according to the invention for carrying out the method has a furnace chamber and at least one heating installation for heating the furnace chamber. There is also at least one additional heating installation provided for the selective heating of at least part of a system brought into the furnace chamber. Said system consists of a substrate and a coating arranged thereon. The word coating is to be understood here in the way explained above. A metal layer provided as back contact is to be assigned to the substrate.

The term selective heating is to be understood as meaning that the additional heating installation essentially heats the at least one part of the system, the furnace chamber and the atmosphere prevailing therein, however, only being slightly or indirectly heated by heat dissipation or heat abstraction from the heated at least part of the system.

The device according to the invention enables a comparatively rapid and energy-efficient heating of the coating to the activation barrier temperature of at least 600° C.

In one variant embodiment of the device according to the invention, at least one cooling installation is provided, by means of which at least one part of the furnace chamber can be cooled.

According to a refinement of the device according to the invention, the at least one additional heating installation is arranged so as to heat the coating of the system selectively. In this case, such selective heating of the coating is to be understood as meaning that the at least one additional heating installation essentially heats the coating, while the furnace chamber and the atmosphere prevailing therein and the substrate, are, however, only slightly or indirectly heated by heat dissipation or heat abstraction from the heated coating. In this way the substrate can be kept at a lower temperature than the coating. In particular, the substrate temperature, as described above, can be kept at values which are safe for the substrate.

Preferably, the at least one additional heating installation is laid out in such a way that it can be used to bring the substrate and the coating to temperatures which differ by at least 30° C., especially preferably by at least 60° C.

In one preferred variant embodiment, at least one additional heating installation is formed by at least one lamp. The word lamp means in principle any source of electromagnetic radiation which emits electromagnetic radiation suitable for heating the coating present in the respective application, or, in this case, the at least one part of the system consisting of coating and substrate. Lamps emitting radiation chiefly in the wavelength range of between 400 nm and 1200 nm have proven useful for the compound semiconductor layers described above and their metallic precursor layers and also for chalcogens. For example, halogen or xenon lamps can be used.

In one variant embodiment of the device according to the invention, the furnace chamber is made from graphite. The at least one heating installation, for example consisting of an electrical resistance heater, and an optional cooling installation, for example consisting of a water cooler, are preferably embedded in the graphite walls. The at least one lamp is advantageously arranged in recesses in the graphite walls.

One refinement makes provision that the at least one lamp is arranged in a holder which is transparent for the radiation emitted by the lamp. This prevents any contamination of the furnace chamber in case the lamp is destroyed. Servicing works can also be carried out with ease. The holder need not necessarily be transparent for all radiation emitted. In principle, transparency in one wavelength range is adequate, which enables the desired selective heating in the respective application. Preferably the transparent holder is designed as a quartz tube.

In practice, twin tube emitters have proven useful as lamps, since these have greater mechanical stability.

In one advantageous variant embodiment, the at least one lamp is arranged behind a pane which homogenises the radiation emitted by the at least one lamp. For example, a glass ceramic pane or a quartz glass pane can be provided.

One continuation of the invention provides for an exhaust gas channel for extracting chalcogens not used in the conversion into the compound semiconductor layer out of the furnace chamber.

In one preferred variant embodiment of the device according to the invention, this is designed as a continuous furnace and the furnace chamber is divided into several segments. Different temperatures can be developed in the various segments. This is done by means of the at least one heating installation and, if there is one, the at least one cooling installation. A transport device is advantageously provided to transport the substrates from one segment to the next, for example a push rod, which has proven useful, in particular when the substrates have identical dwell times in all the segments. In this embodiment, an additional heating installation can be provided, for example within one segment, or additional heating installations can be arranged in several segments.

Preferably, the several segments are thermally insulated from each other, so that significant temperature differentials can be realised between adjacent segments. Additionally, the individual segments can each be thermally insulated against the environment of the device.

Advantageously, a protective gas atmosphere can be developed in the furnace chamber. Gas inlet and outlet lines of prior art can be provided accordingly. In the case of a continuous furnace, gas locks are to be arranged at loading and discharge openings, for example gas curtains of prior art. This allows the substrates to be arranged in a protective gas atmosphere.

In one variant embodiment of the device according to the invention, at least one additional heating installation is arranged between two consecutive segments of the continuous furnace. In this way the at least one part of the system, in particular the coating, can be heated during transport of the substrate from one segment to the next. As a result, in particular, any interference with the temperature in the segments by the at least one additional heating installation can be minimised.

One advantageous variant embodiment of the device according to the invention makes provision that the furnace chamber is encased by a housing and a space is formed between furnace chamber and housing, which has at least one flushing gas inlet and at least one extraction channel. The space formed can be flooded with a flushing gas and this can be suctioned out.

This can reduce the extent of penetration of gases from the environment into the furnace chamber and any escape of process gases from the furnace chamber into the environment. The protective gas atmosphere in the furnace chamber can thus be improved. The housing is in this case preferably designed as a stainless steel housing.

In principle, it is not necessary for the flushing gas introduced into the space to be extracted via the extraction channel. Instead, a sufficiently large influx of flushing gas can be provided so that the extraction channel simultaneously acts as a flushing gas outlet.

One refinement of the device according to the invention makes provision that at least one sensor from the group consisting of an oxygen sensor and a hydrogen selenide sensor is arranged in the space formed between furnace chamber and housing.

In one advantageous variant embodiment the housing is designed to be coolable, so that heat given off by the furnace chamber can be abstracted.

One refinement of the device according to the invention makes provision for a reversing device. This is arranged so as to reverse substrates while they are being heated by the at least one additional heating installation. The substrates are thereby moved around in the area of influence of the additional heating installation, in order to compensate, at least in part, for inhomogeneities, which in the case of a lamp are radiation inhomogeneities. Preferably the reversing device is designed as an oscillation device, so that the substrates can be displaced in oscillating movements.

The invention will next be explained in more detail with the aid of the figures. So far as useful, the elements with the same action are provided with the same reference numbers. The figures show:

DESCRIPTION OF THE INVENTION

Figure 1:
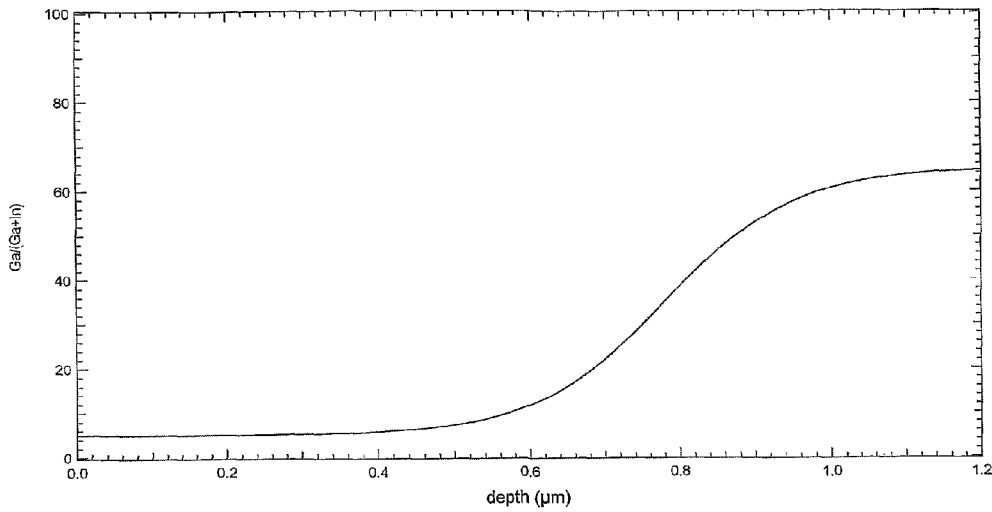
FIG. 1 gallium-depth distribution in a CIGS compound semiconductor layer produced according to the state of the art.

As already explained above, FIG. 1 shows a gallium-depth distribution in a CIGS compound semiconductor layer produced using a method according to the state of the art. This has been produced with a deposition-reaction process at a maximum temperature of the coating of 520° C. A solar cell produced from this compound semiconductor layer has an efficiency of 8.3% and a open circuit voltage of 460 mV.

Figure 2:
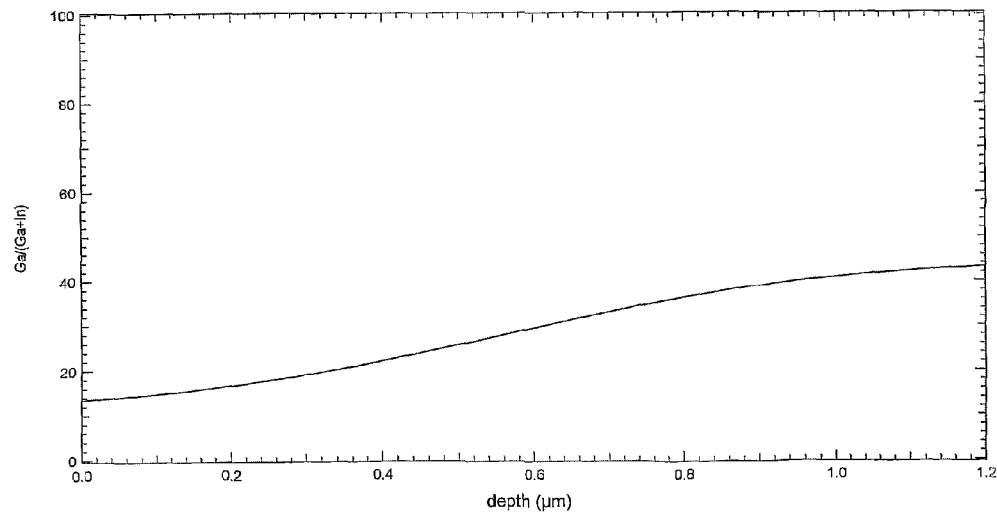
FIG. 2 gallium-depth distribution in a CIGS compound semiconductor layer which was produced by a method according to the invention.

In contrast hereto, FIG. 2 shows a gallium-depth distribution in a CIGS compound semiconductor layer produced using the method according to the invention under a maximum temperature of 640° C. The more homogeneous distribution of the gallium is clearly visible. The solar cell produced from the manufactured compound semiconductor layer shows, at 13.6%, a significantly higher efficiency. As expected, there also arises a higher open circuit voltage, in the amount of 600 mV.

Figure 3:
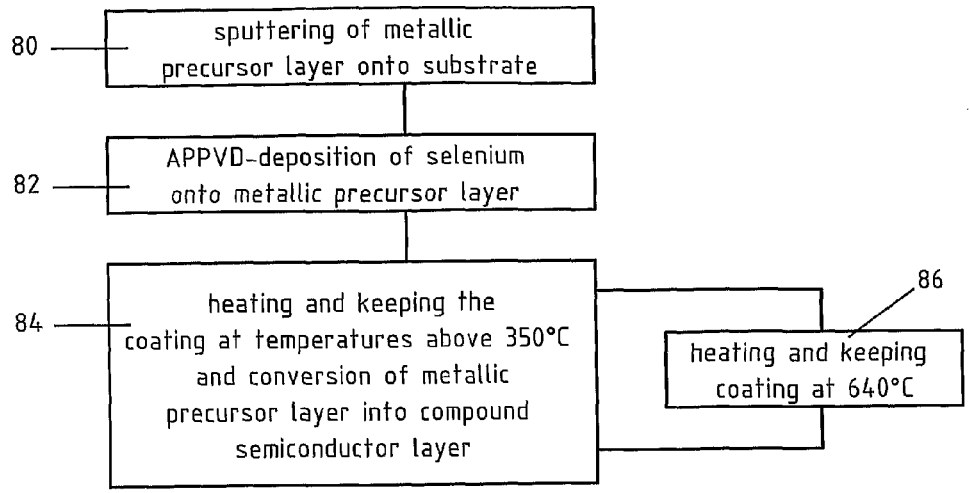
FIG. 3 basic diagram of a first embodiment of the method according to the invention.

FIG. 3 shows a basic diagram of a first embodiment of the method according to the invention. According to this, firstly a metallic precursor layer is sputtered onto a substrate 80. In this case, for example, firstly copper and gallium can be sputtered on together and, in a further deposition process, indium can be sputtered on. A multiple application of a sequence of layers of this or another type is possible in principle. The substrate used is also provided with a metallic back contact coating, on which the layers which are sputtered on come to lie. Here, for example, a molybdenum layer can be used as metallic back contact layer. As described above, this back contact layer is advantageously already structured.

Subsequently, selenium is vapour-deposited at atmospheric pressure onto the metallic precursor layer and thus is pre-capitated thereon 82. This is followed by a heating phase. Also, the coating initially formed from metallic precursor layer and deposited selenium layer is kept at temperatures of over 350° C. 84 and at the same time the metallic precursor layer is converted, using selenium from the deposited 82 selenium layer, into a CIGS compound semiconductor layer 84. While the coating is kept at a temperature of over 350° C. 84, i.e. during the process time, the coating is heated to an activation barrier temperature of 640° C. and kept for an activation time at the activation barrier temperature of 640° C. 86. In other variant embodiments, the temperature of the coating may exceed the activation barrier temperature during the activation time.

Figure 4:
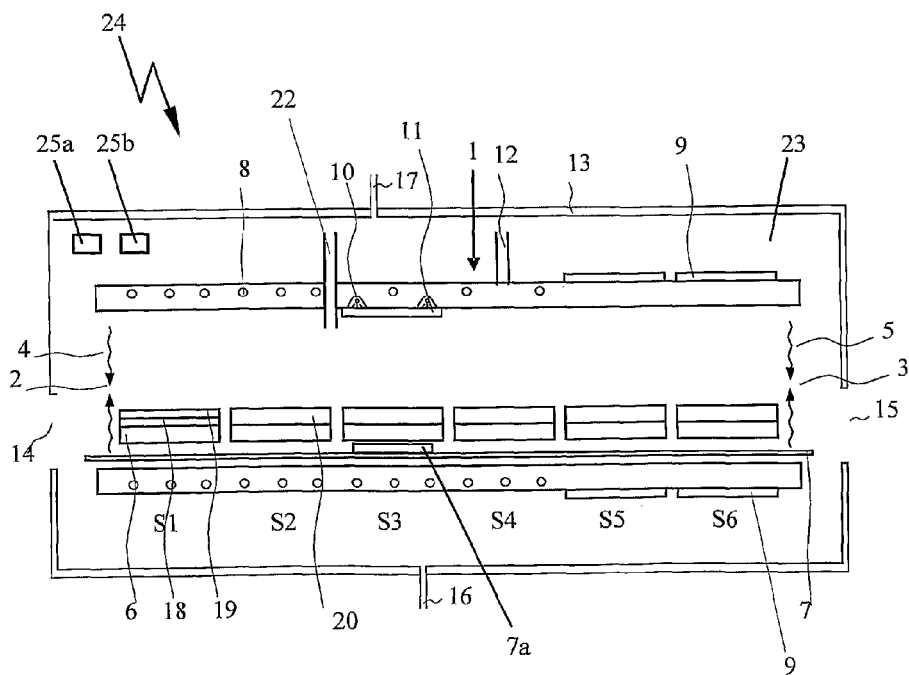
FIG. 4 schematic view of an embodiment of the device according to the invention and illustration of a further embodiment of the method according to the invention.

FIG. 4 shows an embodiment of a device according to the invention, which for example can be used to carry out the method according to the invention in accordance with FIG. 3. The device is designed as a continuous furnace 24 and has a furnace chamber 1, the walls of which are made of graphite or are clad with graphite. The furnace chamber 1 is furthermore divided into several segments S1, S2, S3, S4, S5, S6. In each of these segments S1, S2, S3, S4, S5, S6, by means of the heating installations 8 arranged in segments S1 to S4 and the cooling installations 9 arranged in segments S5 and S6, a coating passing through the furnace chamber 1 can be brought to a predetermined temperature. The heating 8 and cooling installations 9 are preferably embedded in the graphite walls of the furnace chamber 1. The segments S1, S2, S3, S4, S5, S6 are thermally insulated from each other and also each is designed to be thermally insulated from the environment. For the sake of greater clarity, the associated means of insulation are not shown in FIG. 4. Due to the thermal insulation described, significantly different temperatures can be realised in the various segments S1, S2, S3, S4, S5, S6 and energy expenditure can be reduced.

In segment S1, a loading opening 2 is provided via which substrates can be introduced into the furnace chamber 1. Accordingly, segment S6 has a discharge opening 3, via which the substrates can be guided out of the furnace chamber 1. A protective gas atmosphere can be developed in the furnace chamber 1. To this end, and to prevent any penetration of damaging gases, for example gases containing oxygen or hydrogen, into the furnace chamber 1, gas curtains 4, 5 are arranged at the loading opening 2 and at the discharge opening 3. Furthermore, FIG. 4 shows an exhaust gas channel 12 for the extradtion of selenium or other chalcogens not used in the conversion into the compound semiconductor layer out of the furnace chamber 1.

Inside the furnace chamber, a transport device 7 is arranged, by means of which substrates 6 can be transported through the furnace chamber 1. A push rod may be provided as such a transport device 7, for example.

In order to further improve the protective gas atmosphere in the furnace chamber 1, this is provided with a housing 13, which in the present case is designed as a stainless steel housing 13. Corresponding to the loading opening 2 and discharge opening 3 of the furnace chamber 1, this housing has a loading opening 14 and a discharge opening 15. The stainless steel housing 13 is also provided with a flushing gas inlet 17 and with an extraction channel 16. A space 23 formed between the furnace chamber 1 and the stainless steel housing 13 can be flushed with a protective gas, for example nitrogen, via this flushing gas inlet 17 and the extraction channel 16. An oxygen sensor 25a and a hydrogen selenide sensor 25b are arranged in the space 23. This allows any penetration of oxygen or hydrogen into the space 23 to be detected.

FIG. 4 further illustrates an embodiment of a method according to the invention. In this one, first of all a substrate 6 provided with a molybdenum backside contact, on which a metallic precursor layer 18 is applied, for example by means of sputtering 80, and which has also been provided with a selenium layer 19, for example with an APPVD-deposition, is introduced into the furnace chamber 1 via the loading opening 2. Once in segment S1, where the oxygen partial pressure is low because of the protective gas atmosphere, it is heated to about 150° C. Following a further transport into segment S2, it is heated to about 550° C., so that at least a partial conversion of the metallic precursor layer 18 with selenium from the selenium layer 19 into a CIGS compound semiconductor layer 20 takes place. Once the coating 18, 19, initially formed from metallic precursor layer 18 and selenium layer 19, attains a temperature of 350° C., the duration of the process time commences, as the further heating, beyond 350° C. to 550° C., represents a part of keeping the coating 18, 19 at temperatures of at least 350° C.

Next, the substrate is introduced into segment S3, in which the substrate and hence also the coating is heated to 650° C. and thus beyond an activation barrier temperature of 640° C. used for this embodiment. The activation time begins on reaching the activation barrier temperature. Next, in segment S3, the coating temperature of 650° C. is maintained, until the substrate is transported further, into segment S4. There a cooling of the substrate takes place, and also of the coating formed by the CIGS compound semiconductor layer, ultimately to about 600° C. Once the temperature falls below the activation barrier temperature of 640° C., the activation time ends. Unconverted selenium is passed out of segment S4 via the exhaust gas channel 12 out of the furnace chamber 1.

In the adjacent segments S5 and S6, the substrate together with its coating are cooled down with the aid of the cooling installations 9, firstly to about 450° C. and then 300° C., before it is ejected from the continuous furnace 24 via the discharge openings 3 and 15.

In the embodiment described, it has proven useful to leave the substrate in each segment for about 120 seconds. Furthermore, a process time of about 480 seconds has proven useful, during which the substrate and thus also the coating formed from the metallic precursor layer 18 and the selenium layer 19 and/or the CIGS compound semiconductor layer 20 is kept at temperatures of at least 350° C. As activation time, at which substrate 6 and coating 18, 19, 20 are kept at temperatures greater than or equal to the activation barrier temperature of 640° C., a value of 120 seconds has proven useful.

Lamps 10 arranged in the furnace chamber 1 and in segment S3 therein for irradiating the coating of the substrate 6 are not used in the embodiment of the method according to the invention just described. So the substrate as well as the coating are heated in the same way, with the result that they have roughly the same temperature.

In another variant embodiment of the method according to the invention, in which the coating is kept at higher temperatures than the substrate during a boost period, however, the lamps 10 provided can be put to use for this purpose. These lamps 10 are preferably arranged in recesses in the wall of the furnace chamber 1 and each encased by a quartz cladding glass 10, which, in the event of a lamp 10 exploding, enables this to be changed quickly and easily and prevents contamination of the furnace chamber 1. In order to achieve the most homogeneous possible irradiation of the coating 18, 19, 20 by means of the lamps 10, a glass ceramic pane 11 is provided between these lamps 10 and the substrate 6.

The transport device 7 also has a reversing device 7a, which in this case is designed as an oscillation device 7a and by means of which, in segment S3, the substrate 6 can be oscillated under the glass ceramic pane 11, in order to enable a homogeneous irradiation of the coating 20 with the electromagnetic radiation emitted by the lamps 10.

In the embodiment of the method according to the invention described in connection with FIG. 4, selenium from the selenium layer 19 is made available as chalcogen for the conversion of the metallic precursor layer 18 into the CIGS compound semiconductor layer 20. Instead of or in addition to this, in another variant embodiment of the method according to the invention, a chalcogen, in particular selenium, can be made available for the conversion via a selenium vapour feed 22 into the furnace chamber 1. Via this selenium vapour feed 22, for example, selenium in vapour form can be introduced by means of a carrier gas into the furnace chamber 1.

Figure 5:
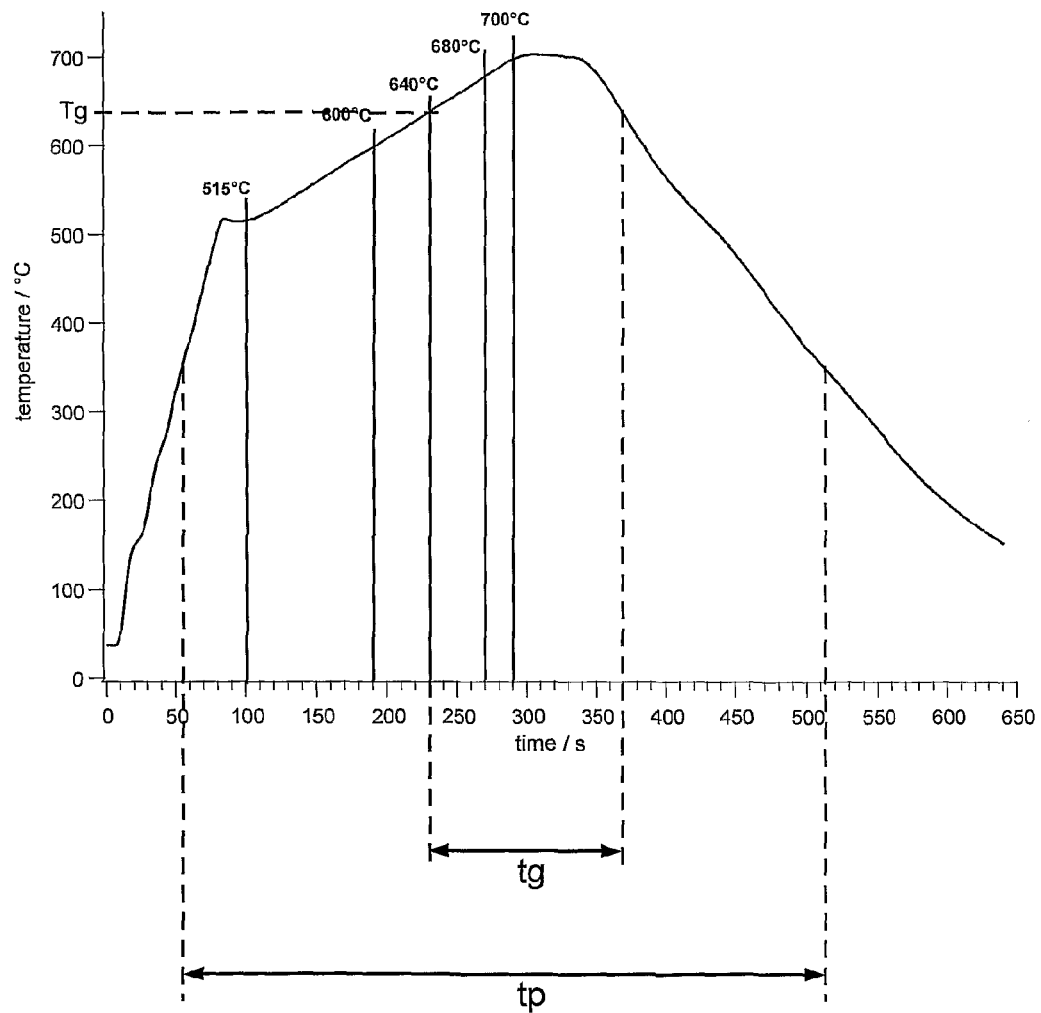
FIG. 5 time-temperature profile of a substrate in a further embodiment of the method according to the invention in which the substrate is heated in the same way as the coating arranged thereon.

FIG. 5 shows the time-temperature profile of coating and substrate in a further embodiment of the method according to the invention. In this one, again, a layer containing copper and gallium as well as an indium layer is sputtered onto a glass substrate provided with a molybdenum back contact and a selenium layer is deposited by means of APPVD. The heating of the substrate and the coating takes place, not in a continuous furnace, but in a conventional furnace under a nitrogen protective gas atmosphere at approximately atmospheric ambient pressure. As can be deduced from FIG. 5, the substrate and its coating are firstly heated, with a temperature increase of about 6° C./s, to a temperature of about 500° C., before the substrate is brought, at a heating-up rate of about 1° C./s, to a final temperature of 700° C. and is kept at this temperature value for about 30 s. There then follows a cooling of the substrate. A temperature of 640° C. is selected as activation barrier temperature Tg. So the process time tp, as represented in FIG. 5, is about 450 s, and the activation time tg about 140 s.

Figure 6:
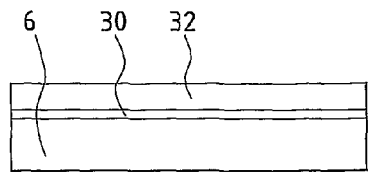
FIG. 6 snapshot in schematic view of a coating arranged on a substrate, which has already run through part of the process time, but has not yet been heated to the activation barrier temperature or beyond.
Figure 7:
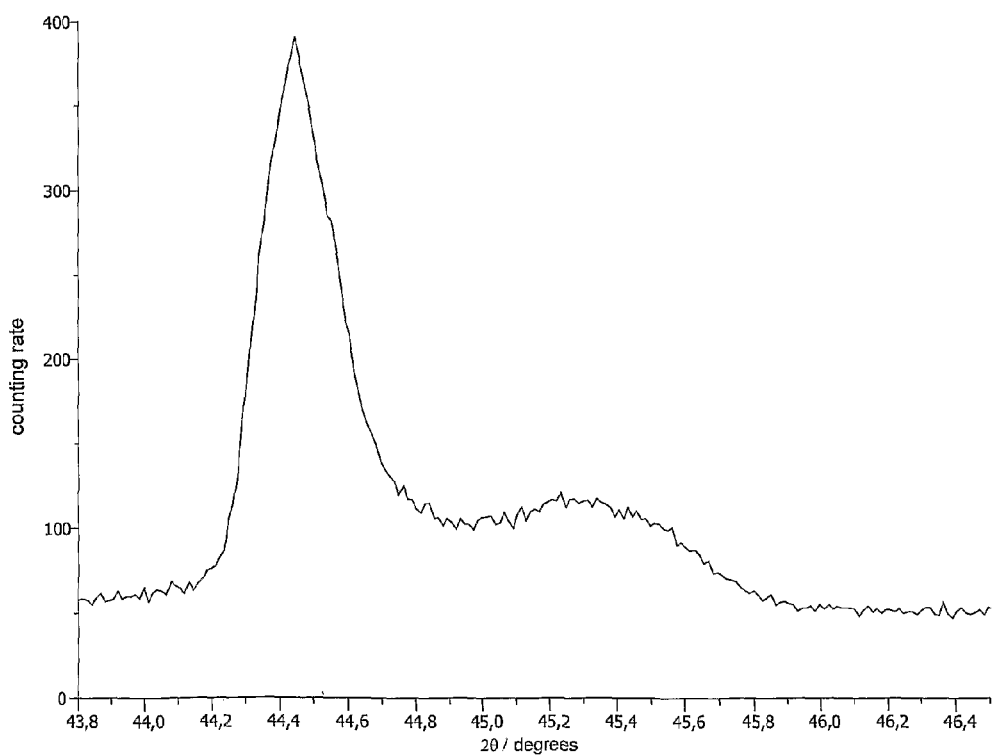
FIG. 7 result of an X-ray diffraction measurement according to Bragg-Brentano on the layer structure shown in FIG. 6.
Figure 8:
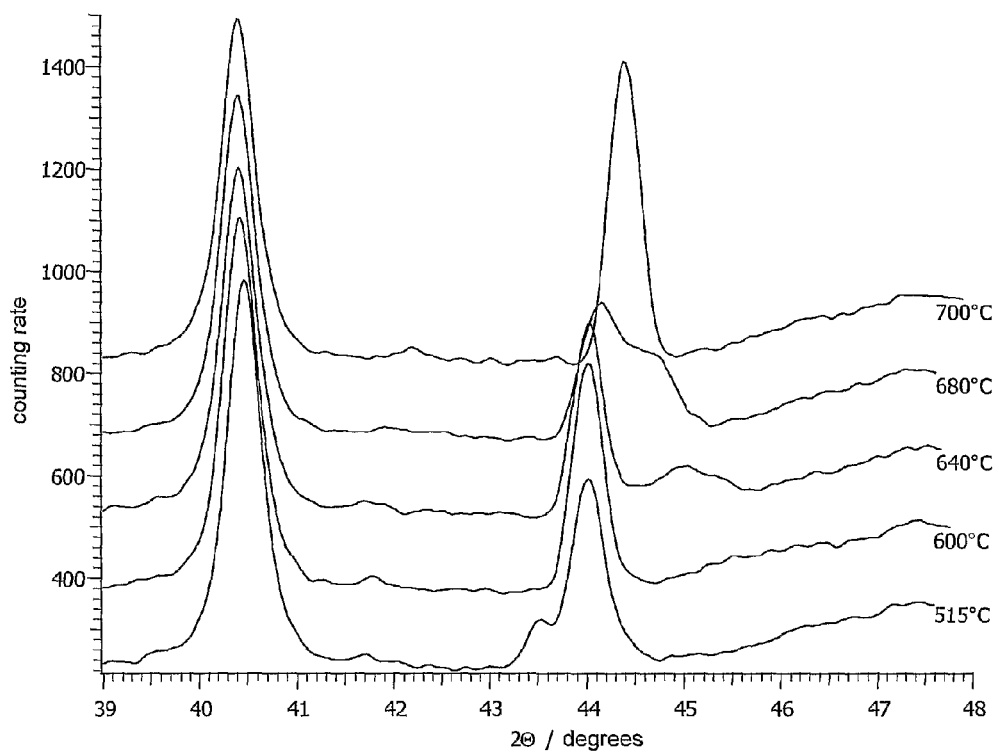
FIG. 8 results from measurements conducted at various temperatures during the heating of the coating of the angular-dependent intensity of the diffracted X-radiation.

FIGS. 6 to 8 illustrate the fact that the method according to the invention enables a more homogeneous gallium distribution in the compound semiconductor layer produced and that temperature influences homogeneity. FIG. 6 shows a snapshot of a substrate provided with a coating during the method according to the invention before reaching the activation barrier temperature. In this moment, similarly to CIGS compound semiconductor layers produced according to the state of the art, there is a gallium-rich and indium-poor CIGS layer 30 close to the substrate, and/or the back contact arranged on the substrate 6 and not illustrated. Above this is a comparatively gallium-poor CIGS layer 32, which correspondingly contains more indium.

FIG. 7 shows the result of an X-ray diffraction measurement according to Bragg-Brentano on a layer structure similar to that shown in FIG. 6. The 220/204-reflection of the chalcopyrite structure is visible. The peak with a maximum at about 44.5° results from diffracting the X-rays on the gallium-poor CIGS layer 32. On the right flank of this peak can be seen the superposition with a second, significantly weaker signal, which results from diffracting the X-rays on the gallium-rich CIGS layer 30. This is due to the fact that a higher gallium proportion in a CIGS alloy leads to a smaller lattice constant and hence to a greater diffraction angle. The intensity of the radiation diffracted on the gallium-rich CIGS layer 30 is reduced, because of the lesser layer thickness, indicated schematically in FIG. 6, of the gallium-rich CIGS layer 30 and because of X-ray absorption effects in the thicker gallium-poor CIGS layer 32, by comparison with the intensity of the peak of the gallium-poor CIGS layer 32.

Corresponding X-ray diffraction measurements on a substrate treated according to the embodiment from FIG. 5 were conducted at various points in time during the process, which in FIG. 5 are characterised by, the substrate and coating temperature prevailing at the respective point in time. The results of these X-ray diffraction measurements are reproduced in FIG. 8, where the graphs of the individual measurements are vertically displaced from each other for the purpose of easier comparability.

The peaks with maxima at about 40.4° represent a 110-reflection of the molybdenum of the back contact arranged on the substrate. As can be seen from FIG. 8, this reflection does not undergo any substantial modification during the thermal treatment.

The graph reflecting the measurement results on attaining a substrate and/or coating temperature of 515° C. has a peak with a maximum at about 44°. This corresponds to the 220/224-reflection of copper indium selenide or a very gallium-poor CIGS layer, where the transitions are fluid. The corresponding peak of the graph belonging to a substrate and/or coating temperature of 600° C. already reveals on its right flank a superimposed, further peak, representing the 220/204-reflection of a gallium-rich CIGS layer, as has already been discussed in connection with FIGS. 6 and 7. The compound semiconductor layer thus consists, at the time of measurement of the 600° C. graph, of a very gallium-poor CIGS layer (peak at approx. 44°) and a CIGS layer with a high proportion of gallium.

At a temperature of 640° C. the superimposed further peak is more strongly marked and has shifted towards smaller angles, the peak at about 44° appears weaker. This indicates an exchange of indium from the gallium-poor CIGS layer with gallium from the gallium-rich CIGS layer. Furthermore, the peak at approx. 44° begins to shift towards larger angles, which indicates that gallium is diffused on the upper side of the gallium-poor CIGS layer, which has a positive effect on open circuit voltage and efficiency of a solar module and/or a solar cell produced. The shift trends described stand out even more clearly in the graph belonging to a substrate- and coating temperature of 680° C.

FIG. 8 thus illustrates that in the embodiment examined, by keeping the coating at or above an activation barrier temperature of 640° C. for a certain time, a CIGS compound semiconductor layer with significantly improved homogeneity over the thickness of the compound semiconductor layer can be manufactured. As already explained above, further investigations have revealed that, depending on how the method is carried out, even activation barrier temperatures of 600° C. can lead to an improved homogeneity of the compound semiconductor layers manufactured.

Figure 9:
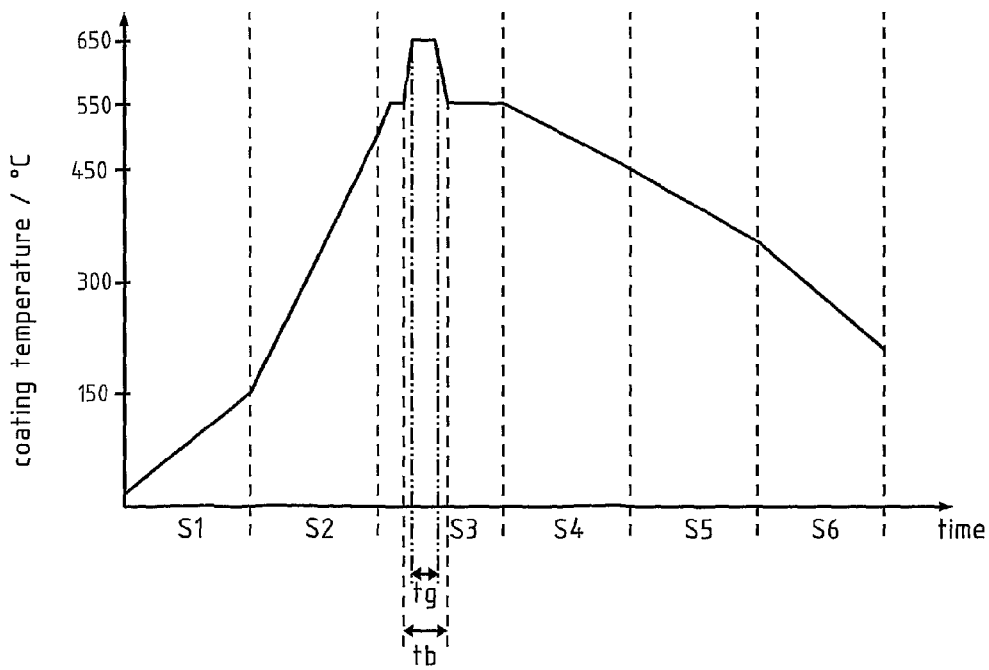
FIG. 9 basic diagram of the time-temperature profile of the coating during the application of a further embodiment of the method according to the invention, in which the coating is heated during a boost period to a higher temperature than the substrate.

FIG. 9 illustrates, with the aid of the time-temperature profile of the coating, in a simplified schematic view, a further embodiment of the method according to the invention, which can, for example, be carried out with the continuous furnace shown in FIG. 4 using the lamps 10 arranged in the continuous furnace 24. It is therefore described by way of example, making reference to the illustration in FIG. 4.

In this embodiment, a float glass substrate 6 provided with a molybdenum back contact and coated with a metallic precursor layer 18 and also an APPVD-selenium layer 19 is introduced via the loading openings 2, 14 into the first segment S1 of the furnace chamber 1, where it is heated, together with the coating composed of metallic precursor layer 18 and selenium layer 19, to 150° C. It is next moved on to segment S2 where, together with coating 18, 19, 20, it is heated to a temperature of about 500° C., before being placed in segment S3. Once the coating attains a temperature of 350° C. in segment S2, the duration of the process time commences. Substrate 6 and coating 18, 19, 20 are firstly heated together in segment S3 to a temperature of 550° C. Until this point, the temperature profiles of substrate 6 and coating 18, 19, 20 are essentially identical. Next, however, the coating 20 (the conversion of the metallic precursor layer 18 and the selenium layer 19 has largely already taken place in the meantime) is heated by means of the lamps 10, as indicated in FIG. 9, more intensely than the substrate 6 and as a result is kept at higher temperatures during a boost period tb than the substrate 6. As a result of the more intense heating by the lamps 10, the coating 20 attains a maximum temperature of about 650° C. and thereby, exceeds the activation barrier temperature of 640° C. used in this embodiment. Consequently, the coating 20 is kept at higher temperatures throughout the entire activation time tg than the substrate. The boost period tb in the embodiment in FIG. 9 is longer than the activation time tg.

The boost period tb is selected to be comparatively brief, preferably 15 s. During this time, the glass substrate is unable to follow the temperature increase of the coating and remains at a safe temperature for the glass substrate 6 of under 580° C. The coating cools down again correspondingly quickly after switching off the lamps 10, to 550° C. Both substrate 6 and coating 20 are then transported into segments S4 to S6, where they are successively cooled down; in segment S4 to about 450° C., in segment S5 to about 350° C. and in segment S6, finally, to about 200° C. As dwell time in each of the segments S1, S2, S3, S4, S5, S6, for example, 120 s may be provided.

In order to enable a homogeneous illumination of the coating 20 by means of the lamps 10, the transport device 7 of the continuous furnace 24, as described above, is designed to set the substrate, at least in segment S3, in reverse movements, for example in oscillation, in order to ensure a homogeneous illumination of the coating by means of the lamps 10.

The lamps 10 can in principle also be arranged at a location other than in segment S3, for example between individual segments. The coating could be illuminated in this way while the substrate is being transported from one segment to the next. Furthermore, a combination of lamps 10 arranged in segment S3, or in other segments, and lamps arranged between adjacent segments is also possible.

Figure 10:
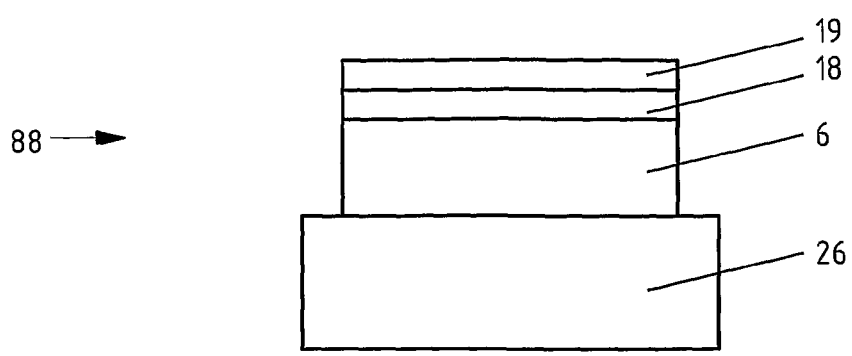
FIG. 10 schematic view of the arrangement of the substrate on a thermally inert carrier according to one variant embodiment of the method according to the invention.

In another variant embodiment of the method according to the invention, the substrate is arranged on a thermally inert carrier, i.e. a carrier with relatively great thermal mass, in order to keep the substrate and the coating at different temperatures. To this end, as shown schematically in FIG. 10, the substrate 6 is arranged 88 on a thermally inert carrier material, in this case a graphite plate 26. Because of the resulting thermal coupling between substrate 6 and graphite plate 26, the substrate 6 is less able to follow any heating of the coating, or even heats up only with a delay. This can be exploited to heat the coating 18, 19, 20 to higher temperatures, and/or to keep it at higher temperatures, than the substrate 6. The arrangement 88 described of the substrate 6 on a thermally inert carrier, in particular a graphite plate 26, can take place as an alternative or in addition to the described heating of the coating by means of lamps. In particular, the substrate 6 can run through the continuous furnace 24 on the graphite plate 26 from FIG. 4.

LIST OF REFERENCE NUMBERS

1 furnace chamber
2 loading opening
3 discharge opening
4 gas curtain
5 gas curtain
6 substrate with molybdenum backside contact
7 transport device
7a oscillation device
8 heating installation
9 cooling installation
10 lamp in quartz tube
11 glass ceramic plate
12 exhaust gas channel
13 stainless steel housing
14 loading opening
15 discharge opening
16 extraction channel
17 flushing gas inlet
18 metallic precursor layer
19 selenium layer
20 CIGS compound semiconductor layer
22 selenium vapour feed
23 space
24 continuous furnace
25a oxygen sensor
25b hydrogen selenide sensor
26 graphite plate
30 gallium-rich CIGS layer
32 gallium-poor CIGS layer
80 sputtering on of metallic precursor layer
82 APPVD-selenium deposition
84 heating and keeping coating at temperature and conversion into compound semiconductor layer
86 keeping coating at activation barrier temperature
88 arranging substrate on graphite plate
S1 first segment of the continuous furnace
S2 second segment of the continuous furnace
S3 third segment of the continuous furnace
S4 fourth segment of the continuous furnace
S5 fifth segment of the continuous furnace
S6 sixth segment of the continuous furnace
Tg activation barrier temperature
tg activation time
tp process time
tb boost period

The invention claimed is:

1. A device for producing a I-III-VI compound semiconductor layer, the device comprising:
   a furnace chamber; a transport device for transporting substrates through said furnace chamber;
   at least one first heating installation for heating said furnace chamber;
   at least one second heating installation for selective heating of at least part of a system introduced into said furnace chamber, the system containing a substrate and a coating disposed on the substrate, said second heating installation having at least one lamp for irradiating the at least part of the system; and
   reversing device for reversing the substrates while they are being heated by means of said at least one lamp.

2. The device according to claim 1, further comprising a housing encasing said furnace chamber, said housing providing a protective gas atmosphere to said furnace chamber for limiting a presence of oxygen.

3. The device according to claim 1, wherein said at least one second heating installation is one of a plurality of second heating installations.

4. The device according to claim 3, wherein said at least one second heating installation further contains a pane, wherein said at least one lamp is disposed behind said pane which homogenizes radiation emitted by said at least one lamp.

5. The device according to claim 1, wherein the device is configured as a continuous furnace having said furnace chamber being divided into several segments, whereby different temperatures can be developed in said different segments and whereby said several segments are thermally insulated from each other.

6. The device according to claim 5, wherein said at least one second heating installation is one of a plurality of second heating installations and at least one of said second heating installations is disposed within one of said segments of said continuous furnace.

7. The device according to claim 5, wherein said at least one second heating installation is one of a plurality of second heating installations and at least one of said second heating installations is disposed between two consecutive ones of said segments of said continuous furnace.

8. The device according to claim 1, further comprising:
   a housing encasing said furnace chamber and a space is formed between said furnace chamber and said housing;
   at least one flushing gas inlet supported by said housing; and
   at least one extraction channel supported by said housing.

9. The device according to claim 4, wherein said pane is selected from the group consisting of a glass ceramic pane and a quartz glass pane.

10. The device according to claim 8, wherein said housing is a stainless steel housing.

11. The device according to claim 1, wherein said reversing device is an oscillation device.

12. The device according to claim 3, wherein said one second heating installation has a holder and said at least one lamp is disposed in said holder which is transparent for light emitted by said lamp, and is configured as a quartz tube.

* * * * *